US012677399B2

(12) United States Patent
Borø et al.

(10) Patent No.: US 12,677,399 B2
(45) Date of Patent: Jul. 7, 2026

(54) SYSTEM AND METHOD FOR OPTIMIZED COOLING AND SIMPLIFIED HANDLING OF DATA PROCESSING EQUIPMENT

(71) Applicant: Orca Connex AS, Kristiansand S (NO)

(72) Inventors: Yngvar Borø, Søgne (NO); Roar Berge, Kristiansand S (NO); Andreas Hauland Næss, Kristiansand (NO); Sigurd Tollevik, Kristiansand (NO)

(73) Assignee: Orca Connex AS, Kristiansand S (NO)

( * ) Notice: Subject to any disclaimer, the term of this patent is extended or adjusted under 35 U.S.C. 154(b) by 0 days.

(21) Appl. No.: 19/107,704

(22) PCT Filed: Aug. 15, 2023

(86) PCT No.: PCT/NO2023/060032
§ 371 (c)(1),
(2) Date: Feb. 28, 2025

(87) PCT Pub. No.: WO2024/054117
PCT Pub. Date: Mar. 14, 2024

(65) Prior Publication Data
US 2026/0040500 A1     Feb. 5, 2026

(30) Foreign Application Priority Data
Sep. 5, 2022     (NO) .................................. 20220955

(51) Int. Cl.
*H05K 7/20*               (2006.01)

(52) U.S. Cl.
CPC ..... *H05K 7/20754* (2013.01); *H05K 7/20609* (2013.01); *H05K 7/2079* (2013.01)

(58) Field of Classification Search
CPC ....... H05K 7/202; H05K 7/206–20609; H05K 7/20754; H05K 7/2079
See application file for complete search history.

(56) References Cited

U.S. PATENT DOCUMENTS

| | | | |
|---|---|---|---|
| 6,506,111 B2 * | 1/2003 | Sharp ................. | H05K 7/20754 165/122 |
| 6,538,883 B1 * | 3/2003 | Greer ................. | H05K 7/20609 174/15.2 |

(Continued)

FOREIGN PATENT DOCUMENTS

| | | | |
|---|---|---|---|
| EP | 0007396 A1 * | 2/1980 | ......... H05K 7/20609 |
| EP | 2487326 | 8/2012 | |

(Continued)

OTHER PUBLICATIONS

International Search Report and the Written Opinion for PCT/NO2023/060032, dated Dec. 11, 2023.

(Continued)

*Primary Examiner* — Robert J Hoffberg
(74) *Attorney, Agent, or Firm* — ANDRUS INTELLECTUAL PROPERTY LAW, LLP

(57) ABSTRACT

A container is for housing a first data center and connecting to a heat exchanger. The container has an outer shell defining an inside and outside of the container. The outer shell has a first container inlet port for receiving a flowable heat transfer fluid from a heat exchanger and a first container outlet port for delivering the flowable heat transfer fluid to the heat exchanger. A means is for holding a first data center at a first location inside the container. A closed fluid flow channel fluidly connects the first container inlet port with the first container outlet port. At least a portion of the closed fluid flow channel is adjacent the first location such that a flowable heat transfer fluid can enter the container at the first container inlet port and extract heat from the first data center before exiting the container at the first container outlet port.

16 Claims, 11 Drawing Sheets

(56)                    References Cited

U.S. PATENT DOCUMENTS

| | | | | |
|---|---|---|---|---|
| 6,652,373 | B2 * | 11/2003 | Sharp | H05K 7/20754 165/122 |
| 6,652,374 | B2 * | 11/2003 | Sharp | H05K 7/20754 165/122 |
| 6,804,114 | B1 * | 10/2004 | Greer | H05K 7/20609 361/679.48 |
| 7,011,576 | B2 * | 3/2006 | Sharp | H05K 7/20754 165/122 |
| 7,309,279 | B2 * | 12/2007 | Sharp | H05K 7/20754 361/695 |
| 7,738,251 | B2 * | 6/2010 | Clidaras | H05K 7/2079 454/118 |
| 8,218,322 | B2 * | 7/2012 | Clidaras | G06F 1/20 454/118 |
| 8,300,402 | B2 * | 10/2012 | Wei | H05K 7/20754 165/122 |
| 8,427,831 | B2 * | 4/2013 | Wei | H05K 7/20754 165/80.4 |
| 8,743,543 | B2 * | 6/2014 | Clidaras | H05K 7/1497 454/118 |
| 8,867,204 | B1 * | 10/2014 | Gardner | H05K 7/1497 361/679.49 |
| 10,634,113 | B2 | 4/2020 | Sheldon-Coulson | |
| 12,195,142 | B2 | 1/2025 | Sheldon-Coulson | |
| 2002/0173266 | A1 | 11/2002 | Sharp | |
| 2004/0132398 | A1 * | 7/2004 | Sharp | A62C 3/16 454/184 |
| 2012/0075794 | A1 * | 3/2012 | Wei | H05K 7/1498 361/679.48 |
| 2013/0083476 | A1 | 4/2013 | Clidaras | |
| 2015/0382511 | A1 | 12/2015 | James | |
| 2015/0382515 | A1 | 12/2015 | James | |
| 2017/0049005 | A1 | 2/2017 | Chen | |
| 2017/0280577 | A1 | 9/2017 | Laneryd | |
| 2018/0054916 | A1 | 2/2018 | Kosugi | |
| 2018/0153059 | A1 | 5/2018 | Dehlsen | |
| 2019/0219311 | A1 | 7/2019 | Smith | |
| 2019/0353139 | A1 | 11/2019 | Sheldon-Coulson | |
| 2020/0348034 | A1 | 11/2020 | Magcale | |
| 2022/0314147 | A1 | 10/2022 | Baetzold | |
| 2023/0080447 | A1 | 3/2023 | Shah | |
| 2023/0240051 | A1 | 7/2023 | Gao | |
| 2023/0324322 | A1 | 10/2023 | Tuma | |
| 2023/0389231 | A1 | 11/2023 | Chen | |
| 2024/0057286 | A1 | 2/2024 | Lin | |
| 2026/0006759 | A1 * | 1/2026 | Borø | H05K 7/20781 |

FOREIGN PATENT DOCUMENTS

| | | |
|---|---|---|
| EP | 2988579 | 2/2016 |
| JP | 2017002905 | 1/2017 |
| SE | 1400472 | 10/2014 |
| WO | 2019222421 | 11/2019 |
| WO | 2020104700 | 5/2020 |

OTHER PUBLICATIONS

Response to the Written Opinion for PCT/NO2023/050023/060032, dated Jun. 11, 2024.

Search Report for Norwegian Application No. 20220955, dated Mar. 17, 2023.

International Preliminary Report on Patentability for PCT/NO2023/060032, dated Jul. 22, 2024.

Office Action issued in U.S. Appl. No. 19/107,697, dated Jan. 13, 2026.

* cited by examiner

SYSTEM AND METHOD FOR OPTIMIZED COOLING AND SIMPLIFIED HANDLING OF DATA PROCESSING EQUIPMENT

CROSS-REFERENCE TO RELATED APPLICATIONS

This application is the U.S. national stage application of International Application No. PCT/NO2023/060032, filed Aug. 15, 2023, which international application was published on Mar. 14, 2024, as WO 2024/054117 in the English language. The International Application claims priority to Norwegian patent application Ser. No. 20/220,955, filed Sep. 5, 2022. The international application and Norwegian application are both incorporated herein by reference, in their entirety.

FIELD

The present invention relates to cooling of data centres. More specifically, the invention relates to a system and method for optimized cooling and simplified handling of data processing equipment.

BACKGROUND

A data centre is a collection of computing infrastructure, including but not limited to: routers, servers, switches, hard drives and controllers. Operating a large data centre is an energy intensive project. A large amount of electricity is used to run a large data centre, therefore energy costs of operation are a major consideration in the design of a new data centre.

Electrical energy costs are incurred in providing power to the actual computers and network components of the data centre such that they can operate to store, maintain and retrieve data properly. Additional substantial electrical energy is provided to keep the data centre sufficiently cool such that it does not overheat or malfunction. Many solutions have been proposed to keep data centres sufficiently cool in an energy efficient way.

US patent document US 2018/0153059A1 discloses a marine subsea data vessel including a plurality of server boards in certain embodiments forming a carousel with a heat exchanger system located within the carousel. The heat exchanger system operates to extract heat from airflow over the server boards and transfer the heat to seawater entirely surrounding the marine subsea data vessel.

US patent document US2019/0219311A1 discloses a system and method for cooling of electronic equipment, for example a computer system, in a subsurface environment including a containment vessel in at least partial contact with subsurface liquid or solid material. The containment vessel may be disposed in a variety of subsurface environments including boreholes, man-made excavations, subterranean caves, as well as ponds, lakes, reservoirs, oceans or other bodies of water. The containment vessel may be installed with a subsurface configuration allowing for human access for maintenance and modification. Cooling is achieved by one or more fluids circulating inside and/or outside the containment vessel, with a variety of configuration of electronic devices disposed within the containment vessel.

US Patent Document 2002/0173266A1 discloses a system for removing heat from a plurality of electronic assemblies including a cabinet having brackets for supporting electronic assemblies in a vertical array between a first vertical airflow path and a second vertical airflow path of the cabinet, and a plinth underlying the cabinet and having an input port receiving air from the first vertical airflow path of the cabinet, an output port transmitting air to the second vertical airflow path, a heat exchanger positioned in an airflow path extending between the input and the output ports, and a fan assembly for driving air through the heat exchanger and towards the input port. The system further includes at least one airflow distribution device establishing a predetermined flow rate distribution through electronic assemblies supported by the brackets.

A further known problem is the presence of marine life on data centres submerged in cooling water. It is known that marine life greatly impacts the ability of the data centre or heat exchangers associated with the data centres to transfer heat to the cooling water. In this connection, regular cleaning is required to ensure optimal cooling. Regular cleaning is time consuming and requires access to the data centre which may be located at a remote location. Furthermore, there may be a down period in which the data centre cannot be used while it is cleaned of marine life. As cleaning and maintenance intervals are reduced, the operating cost of running a data centre is increased.

A further known problem is that the cooling arrangements provided for data centres are often complicated and expensive, and may make maintenance, servicing or changing out of computing components within the data centre, or changing out of the entire data centre itself, complicated and time consuming.

Patent document US2017/280577A1 discloses a pressure compensated subsea electrical system which has a housing filled with a dielectric liquid. The housing has a first housing portion and a second housing portion in pressure communication with each other. The first housing portion includes a transformer, and the second housing portion includes a power converter. The pressure compensated subsea electrical system includes a pressure compensator arranged to compensate pressure inside the housing. The pressure compensator is enabled to compensate pressure in both the first housing portion and the second housing portion.

Patent document SE1400472A1 discloses an arrangement for cooling electrical components of a subsea electric system. The arrangement comprises a tank filled with a dielectric fluid. The arrangement comprises at least one electric component located in the tank. The arrangement comprises a cooling surface in thermal contact with the dielectric fluid in the tank on one side of the cooling surface and in thermal contact with an environment surrounding the tank on the other side of the cooling surface. In an operating state the dielectric fluid receives heat from the at least one electric component, flows through the tank to the cooling surface, flows along the cooling surface to transfer heat to the environment, and flows back from the cooling surface to the tank. The cooling surface is made of aluminum.

Patent document WO2019/222421A1 discloses A buoyant wave energy device that incorporates an open-bottomed tube of substantial length in which is partially enclosed a first body of water that oscillates in response to wave action. The device incorporates a buoy to which an upper end of the tube is connected and inside of which is trapped a second body of water of substantial mass. A differential phase in the oscillations of the water trapped in the tube, and the oscillations of the buoy of augmented mass, result in the periodic compression of a pocket of air trapped at the top of the tube, and in the subsequent expulsion of pressurized air through a turbine, thereby generating electrical power.

The invention has for its object to remedy or to reduce at least one of the drawbacks of the prior art, or at least provide a useful alternative to the prior art.

The object is achieved through features, which are specified in the description below and in the claims that follow.

SUMMARY

According to a first aspect of the invention, there is provided a container for housing a first data centre and connecting to a heat exchanger in use, the container comprising: an outer shell defining an inside of the container and an outside of the container, the outer shell comprising: a first container inlet port for receiving a flowable heat transfer fluid from a heat exchanger in use; and a first container outlet port for delivering the flowable heat transfer fluid to the heat exchanger in use; a means for holding a first data centre at a first location inside the container; and a closed fluid flow channel fluidly connecting the first container inlet port with the first container outlet port; wherein at least a portion of the closed fluid flow channel is adjacent the first location such that in use a flowable heat transfer fluid can enter the container at the first container inlet port and extract heat from the first data centre before exiting the container at the first container outlet port, wherein the container is configured to be at least partially submerged in water and the outer shell is configured to stop the water from entering the container, wherein the container further comprises a means for holding a second data centre at a second location inside the container and the outer shell further comprises a second container outlet port for delivering the flowable heat transfer fluid to the heat exchanger in use, wherein the closed fluid flow channel connects the first container inlet port with the second container outlet port, and at least a portion of the closed fluid flow channel is adjacent the second location such that in use a flowable heat transfer fluid can enter the container at the first container inlet port and extract heat from the second data centre before exiting the container at the second container outlet port, wherein the closed fluid flow channel comprises: a first central fluid flow channel directly connected to the first container inlet port; a first outer fluid flow channel directly connected to the first container outlet port; and a second outer fluid flow channel directly connected to the second container outlet port; wherein the portion of the first closed fluid flow path adjacent the first location is at least a portion of the first central fluid flow channel and at least a portion of the first outer fluid flow channel; and the portion of the first closed fluid flow path adjacent the second location is at least a portion of the first central fluid flow channel and at least a portion of the second outer fluid flow channel.

The outer shell may be in the form of a rectangular prism.

The first closed flow channel may comprise a positive displacement device.

The positive displacement device may be a fluid pump.

The first container inlet port may comprise a non-return valve. The first container outlet port may comprise a non-return valve.

The first container inlet port may be configured to connect to a first heat exchanger outlet port and the first container outlet port is configured to connect to a first heat exchanger inlet port.

The container may be configured to be stab connected to a heat exchanger in use.

The means for holding a first data centre may be one or more of: a rack, a plurality of racks, a slot and a plurality of slots.

The first location may be offset from the outer shell and the closed fluid flow channel is at least partially located between the outer shell and the first location.

The second container inlet port may comprise a non-return valve.

The second container inlet port may be configured to connect to a heat exchanger outlet port.

The means for holding a second data centre may be one or more of: a rack, a plurality of racks, a slot and a plurality of slots.

The second location may be offset from the outer shell and the closed fluid flow channel is at least partially located between the outer shell and the second location.

According to a second aspect of the invention, there is provided a system for cooling a data centre, the system comprising: a container according to the first aspect of the invention; a first data centre held at the first location within the container; a positive displacement device; a heat exchanger comprising a first heat exchanger inlet port and a first heat exchanger outlet port; wherein the heat exchanger is operatively connected to the container such that the first heat exchanger outlet port is fluidly connected to the first container inlet port and the first heat exchanger inlet port is fluidly connected to the first container outlet port; the closed fluid flow channel and the heat exchanger comprise a flowable heat exchange fluid; and the positive displacement device is configured to circulate the flowable heat exchange fluid between the closed flow channel and the heat exchanger, such that the flowable heat exchange fluid can remove heat from the first data centre and transfer the heat to the heat exchanger in use.

According to a third aspect of the invention, there is provided a system for cooling a first data centre and a second data centre, the system comprising: a container according to the first aspect of the invention and further comprising a means for holding a second data centre at a second location inside the container and the outer shell further comprises a second container outlet port for delivering the flowable heat transfer fluid to the heat exchanger in use, wherein the closed fluid flow channel connects the first container inlet port with the second container outlet port, and at least a portion of the closed fluid flow channel is adjacent the second location such that in use a flowable heat transfer fluid can enter the container at the first container inlet port and extract heat from the second data centre before exiting the container at the second container outlet port; a first data centre held at the first location within the container; a second data centre held at the second location within the container; a positive displacement device; a heat exchanger comprising a first heat exchanger inlet port, a second heat exchanger inlet port and a first heat exchanger outlet port; wherein the heat exchanger is operatively connected to the container such that the first heat exchanger outlet port is fluidly connected to the first container inlet port, the first heat exchanger inlet port is fluidly connected to the first container outlet port and the second heat exchanger inlet port is fluidly connected to the second container outlet port; the closed fluid flow channel and the heat exchanger comprise a flowable heat exchange fluid; and the positive displacement device is configured to circulate the flowable heat exchange fluid between the closed flow channel and the heat exchanger, such that the flowable heat exchange fluid can remove heat from the first and second data centres and transfer the heat to the heat exchanger in use.

The heat exchanger may further comprise a heat exchange medium configured to remove heat from the flowable heat exchange fluid and to dump heat to fluid surrounding the heat exchanger.

According to a fourth aspect of the invention, there is provided a method of cooling a data centre, comprising the steps of: providing a system according to the second aspect of the invention; powering the data centre to generate heat; and circulating the flowable heat exchange fluid through the closed flow channel and heat exchanger, such that heat is removed from the data centre and transferred to the heat exchanger.

According to a fifth aspect of the invention, there is provided a method of cooling a data centre, comprising the steps of: providing a system according to the second or third aspect of the invention wherein the heat exchanger further comprises a heat exchange medium configured to remove heat from the flowable heat exchange fluid and to dump heat to fluid surrounding the heat exchanger; submerging the heat exchanger in a fluid; powering the data centre to generate heat; circulating the flowable heat exchange fluid through the closed flow channel and heat exchanger, such that heat is removed from the data centre and transferred to the heat exchanger; and dumping heat from the heat exchanger to the fluid surrounding the heat exchanger.

The fluid the heat exchanger is submerged in may be water.

BRIEF DESCRIPTION OF THE DRAWINGS

An embodiment of the invention will now be described with reference to the following drawings, in which.

Figures 1, 2:
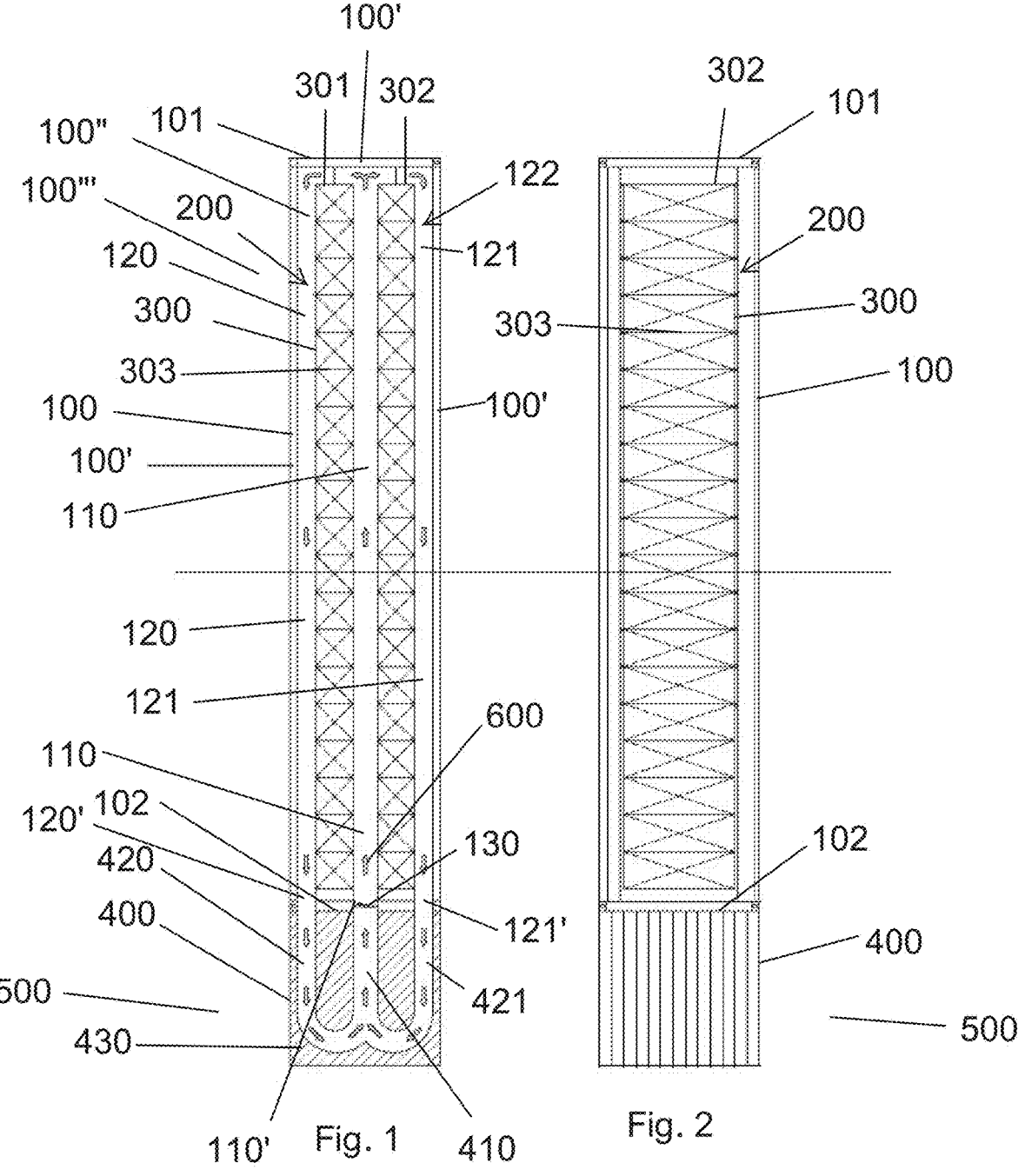
FIG. 1 shows a cross-sectional view of a container connected to a heat exchanger.
FIG. 2 shows a side view of the container of FIG. 1.

For clarity reasons, some elements may in some of the figures be without reference numerals. A person skilled in the art will understand that the figures are just principal drawings. The relative proportions of individual elements may also be distorted.

DETAILED DESCRIPTION OF THE DRAWINGS

FIG. 1 shows a cross-sectional view of a container 100 used for housing a data centre 200. FIG. 2 shows a side view of the container 100 shown in FIG. 1. The data centre 200 comprises a plurality of computing devices 300 arranged vertically within the container 100. More specifically, in the example shown in FIGS. 1 and 2, the devices 300 are arranged in a first vertical column 301 and a second vertical column 302 within the container 100. The computing devices 300 are arranged in racks 303 within the container 100. It will be appreciated that in other examples the computing devices 300 may be arranged in slots within the container 100, or may be held within the container 100 by another holding means. The container 100 has an outer shell 100' defining an inside 100" of the container 100 and an outside 100''' of the container 100. The outer shell 100' is in the form of a rectangular prism in the presently described example, to aid in handling and stacking of the container 100. In other examples, the container 100 may be another shape.

In the presently described example, the computing devices 300 within the container 100 are a plurality of servers and network components such as routers, network switches, storage devices and processors. It will be understood by a person skilled in the art that the computing devices 300 may be any collection of one or more electrically powered devices which give off heat and must be maintained at a sufficiently cool temperature such that they do not overheat and/or malfunction. The container 100 is operatively attached to a heat exchanger 400, as will be explained in more detail later.

Referring to FIG. 1, the container 100 is configured with a container central flow channel 110, a container first outer flow channel 120, and a container second outer flow channel 121. Together the container central flow channel, container first outer flow channel 120 and container second outer flow channel 121 form a closed fluid flow channel 122. The closed fluid flow channel 122 is termed "closed" because it is not open to the outside 100''' of the container 100.

The container central flow channel 110 is arranged between the first 301 and second 302 vertical columns, whilst the container first outer flow channel 120 and container second outer flow channel 121 are arranged between the first vertical column 301 and the outer body of the container 100 and between the second vertical column 302 and the outer body of the container 100, respectively.

Similarly to the container 100, the heat exchanger 400 is configured with a heat exchanger central flow channel 410, a heat exchanger first outer flow channel 420, and a heat exchanger second outer flow channel 421. The three heat exchanger flow channels 410, 420, 421 are set within a heat exchange medium 430, such that heat within a fluid flow in one or more of the three heat exchanger flow channels 410, 420, 421 can be transferred to the heat exchanger medium 430, and then transferred from the heat exchange medium 430 to surrounding water 500 within which the heat exchanger 400 is submerged in use.

As shown in FIG. 1, the heat exchanger central flow channel 410 is connected to the container central flow channel 110 at a first container inlet port 110'. The heat exchanger first outer flow channel 420 is connected to the container first outer flow channel 120 at a first container outlet port 120'. The heat exchanger second outer flow channel 421 is connected to the container second outer flow channel 121 at a second container outlet port 121'. The connections are such that a flowable heat transfer medium 600 may be circulated through the closed fluid flow channel 122, i.e. through channels 110, 120, 121, 410, 420, 421 and pass between the container 100 and the heat exchanger 400 in use. In the presently described example, the connections provide open unrestricted flow in both directions. However, in some other examples, non-return valves may be positions at the connections.

Although in the presently described example the container 100 and the heat exchanger 400 are each provided with three fluid flow channels, in other examples a different number of fluid flow channels may be provide in each of the container 100 and the heat exchanger 400.

In one example, the container 100 may have only outer flow channels 120, 121. In such case, the flowable heat transfer medium 600 may be circulated in a first direction along the first outer flow channel 120 and then circulated in a second direction along the second outer flow channel 121, thus creating a loop whereby the flowable heat transfer medium 600 is circulated around the data centre 200 to remove heat from the data centre 200. Alternatively, in another example, the container 100 may have outer flow channels 120, 121 as shown in FIG. 1, as well as multiple internal flow channels. The internal flow channels need not necessarily be arranged centrally within the container 100, as in FIG. 1. Instead, multiple internal flow channels may be arranged in a space configuration adjacent a plurality of columns of devices 300. The internal flow channels may be arranged vertically, as in FIG. 1. In some examples, the internal flow channels may be arranged horizontally. In some examples, horizontal and vertical internal flow channels may be provided.

Figure 3:
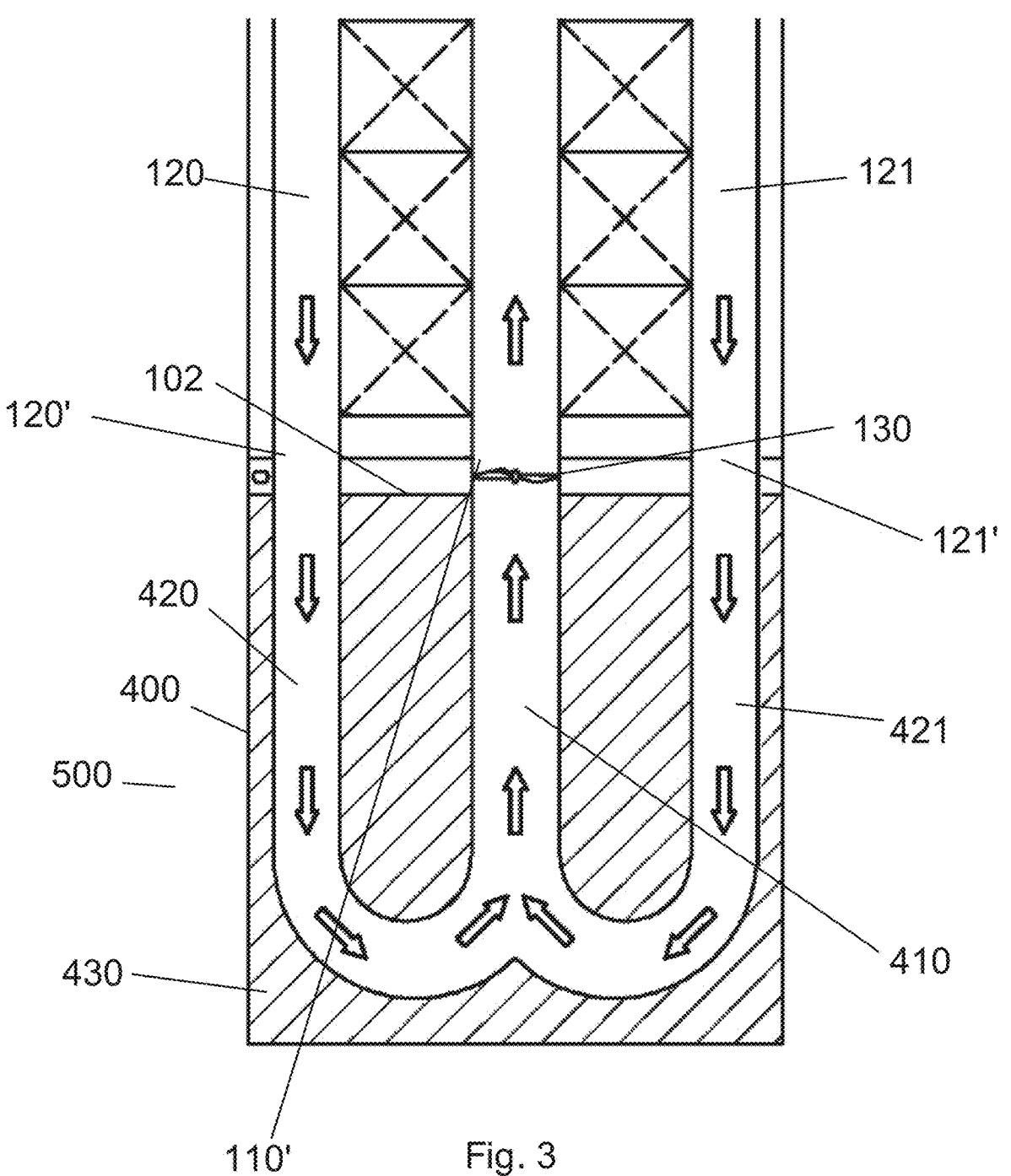
FIG. 3 shows a detailed cross-sectional view of the container of FIG. 1.

Referring to FIGS. 1 and 2, the container 100 has an upper end 101 and a lower end 102. The container 100 is shown in an operative state in FIGS. 1 and 2, wherein the container 100 is operatively connected to the heat exchanger 400. A detailed cross-sectional view of the connection between the heat exchanger 400 and the container 100 is shown in FIG. 3. In the presently described example, the flowable heat transfer medium 600 is air. However, it will be understood that the flowable heat transfer medium 600 may be any suitable flowable heat transfer medium, such as but not limited to, a gas, liquid or aerosol. The air, acting as the flowable heat transfer medium 600, is circulated through the container 100 and heat exchanger 400 by a fan 130. The fan 130 is located near the lower end 102 of the container 100 in the presently described example. However, it will be understood by a person skilled in the art that the fan 130 may be located anywhere on the flow path to provide a circulating flow of the flowable heat transfer medium 600. That is to say, the fan 130 may be located anywhere on the flow path in the container 100 or alternatively anywhere on the flow path in the heat exchanger 400. Further, it will be understood that where a different flowable heat transfer medium 600 is used, such as a liquid, the fan 130 may be replaced by a pump or another positive displacement device arranged to circulate the heat transfer medium 600.

In use heat is generated by the data centre 200 and is transferred to the air 600 which is circulated through the channels 110, 120, 121, 410, 420, 421 as previously explained. Still referring to FIG. 1, heat is transferred from the first vertical column 301 to the air 600 as it passes through the container central flow channel 110 and the container first outer flow channel 120. Similarly, heat is transferred from the second vertical column 302 to the air 600 as it passes through the container central flow channel 110 and the container second outer flow channel 121. The air 600 passes from the container first outer flow channel 120 into the heat exchanger first outer flow channel 420, and from the container second outer flow channel 121 into the heat exchanger second outer flow channel 421. In the heat exchanger first outer flow channel 420 and heat exchanger second outer flow channel 421, the heated air 600 loses heat to the heat exchange medium 430. The air 600 in the heat exchanger first outer flow channel 420 and the heat exchanger second outer flow channel 421 merge into the heat exchanger central flow channel 410, where continued transfer of heat from the merged flow to the heat exchange medium 430 occurs before the cooled flow is transferred back into the container central flow channel 110. In this way, heat from the data centre 200 is transferred to the circulating heat transfer medium 600, and from the heat transfer medium 600 to the heat exchange medium 430 of the heat exchanger 400. The heat within the heat exchange medium 400 can then be transferred to the surrounding water 500 within which the heat exchanger 400 is submerged.

In some examples, not shown, the heat exchanger 400, and optionally part of the container 100, may be submerged in a sea, ocean, lake, river, reservoir, fjord or another natural or man-made body of water. In this connection, there may be a natural or man-made flow of water over the heat exchanger 400. In some examples, there may be a propeller arranged near the heat exchanger 400 to provide water flow over the heat exchanger 400. In other examples, the water may naturally flow, for example if the heat exchanger is positioned in a river. It will be understood that there are myriad ways in which the water may flow over the heat exchanger to ensure the heat exchanger can effectively transfer heat to the surrounding water 500.

Preferably, as shown in FIGS. 1 and 2, only part of the container 100 is submerged in the surrounding water 500. Partially submerging the container 100 in the water ensures that the container 100 is not excessively buoyant, such that weights or a securing means are not required to keep the heat exchanger 400 submerged. In this connection, the flow channels 110, 120, 121 (which may be filled with air or another light gaseous or liquid medium) may be sized such that excessive buoyancy is not created and that the container 100 can be submerged such that around half of the container 100 is submerged in water when neutral buoyancy is reached.

Referring now to FIGS. 4 to 10, a structure 700 is provided to hold a plurality of containers 100 and heat exchangers 400 as described with reference to FIGS. 1 to 3. The structure 700 is configured to be partially submerged in the surrounding water 500. That is to say, the structure 700 is configured to float in the surrounding water 500 such that a lower portion 701 of the structure 700 is submerged in the surrounding water 500 and an upper portion 702 of the structure 700 is maintained not submerged in the surrounding water 500.

Figure 4:
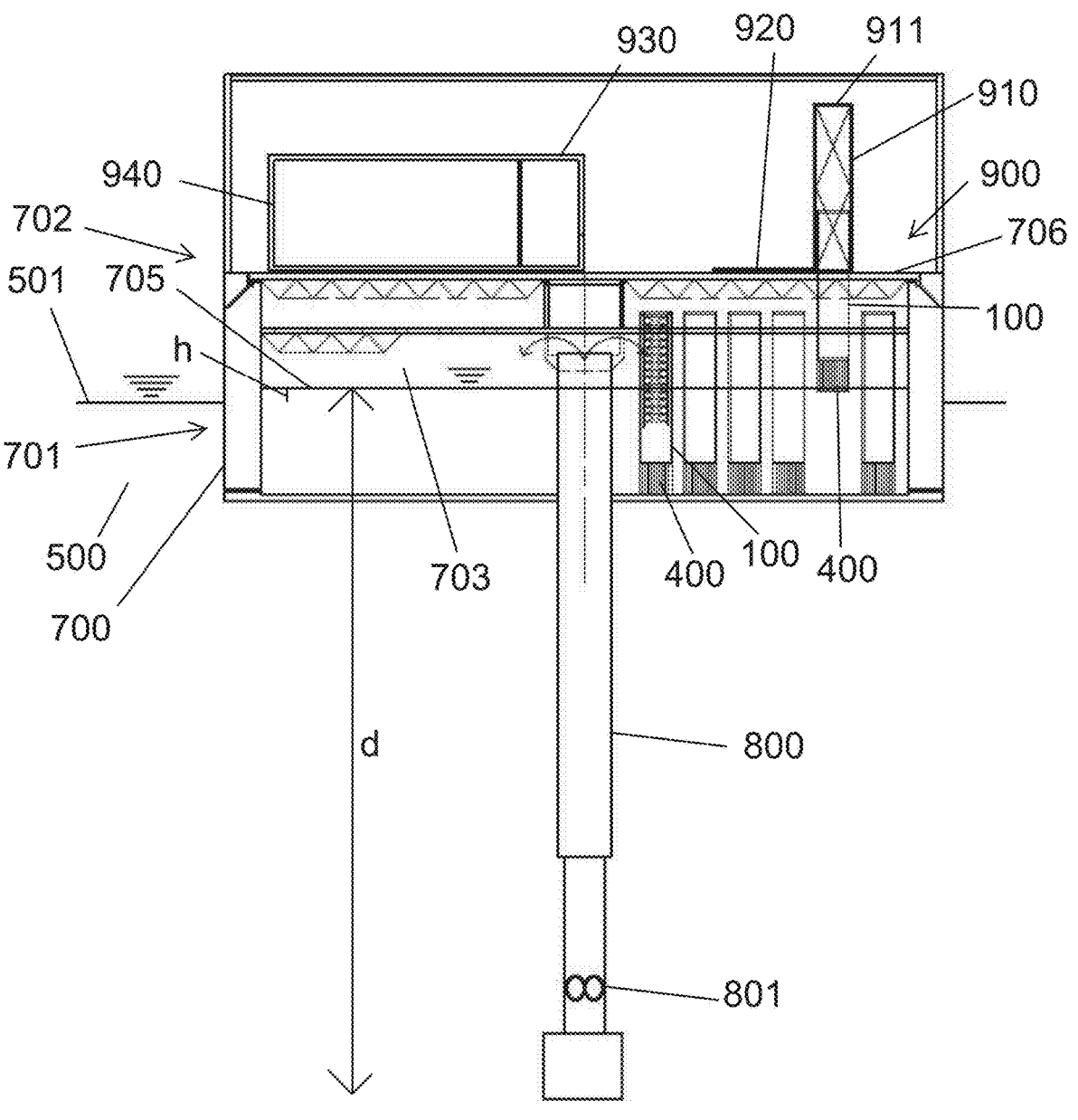
FIGS. 4 to 10 show a container handling system.

An inlet pipe 800 comprising a fluid pump 801 is arranged to pump cold water from the surrounding water 500 to an internal volume 703 of the structure 700. The surrounding water 500 has a water surface 501. The inlet pipe 800 is configured to convey water from a depth d below the water surface 501 to a height h above the water surface 501. The structure 700 is partially filled with water in use, as can be seen in FIG. 4. In this connection, there is an internal volume of water comprising a water surface 705. The containers 100 are arranged to be partially submerged in the internal volume of water, thereby allowing an upper portion of each container 100 to be maintained dry and out of the water usefully providing a safe and dry environment for electrical connections (not shown) to the computer devices 300 within the containers 100 to be made. It some examples (not shown) it may be preferred to completely submerge the containers 100 in water such that optimal cooling can be achieved. In such cases, electrical connection may be made via waterproof connectors.

Water can drain from the structure 700 into the volume of water 500 within which the structure 700 is floating through suitably arranged outlet ports (not shown).

The water surface 705 of the internal volume of water is maintained at a height h above the water surface 501 of the volume of water 500 within which the structure 700 floats, thereby creating an overpressure such that the internal volume of water flows to the outlets. Constant pumping of cold water from the depth d results in a constant overpressure and a constant flow of cold water over the heat exchangers 400. It will be understood that the presently described arrangement and method for providing a constant stream of cold cooling water to the heat exchangers 400 is only one possible example. Other methods of cooling the heat exchangers 400 may be used in other examples. For example, the heat exchangers 400 may be positioned within a natural stream of cold water, such as a river. In other examples, a turbine may propel cold water over the heat exchangers 400.

Heat is transferred from the heat exchangers 400 to the cold water as it passes over the heat exchangers 400. In this way, the data centre 200 is indirectly cooled.

The term indirectly is used to indicate that heat is transferred from the data centre 200 to the heat exchange medium 430 in the heat exchangers 400. Heat is then transferred from the heat exchange medium 430 to the cold water passing over the heat exchangers 400.

It will be appreciated that in the presently described example some of the cold water will pass over the submerged portions of the containers 100. In this connection, the data centre 200 may also be cooled by the cooling effect of the cold water passing over the submerged portions of the containers 100. However, it will be appreciated that dedicated heat exchangers 400 connected to the containers 100 in use efficiently removes heat from the data centre 200, which can then be transferred to the cold water.

Still referring to FIG. 4, the plurality of containers 100 are arranged vertically within the internal volume 703 within the structure 700. In use, the containers 100 are positioned below a work deck 706 in their submerged position.

A container handling system 900 is shown arranged on the work deck 706, i.e. in the dry area of the internal volume 703. The container handling system 900 comprises a container handling machine 910, a skid 920, a transfer room 930 and a clean room 940. The container handling machine 910 is configured to lift and manoeuvre containers 100 between their normal vertical working position, i.e. partially submerged in water below the work deck 706, and a horizontal position within the container handling machine 910 on the skid 920 on the work deck 706 as will now be explained.

To move a container 100 from the partially submerged position below the work deck 706, the container 100 is lifted by the container handling machine 910. In this connection, the container handling machine 910 comprises a container shell 911 which is sized and configured to receive a container 100 therein. The container shell 911 is moved to above the container 100 to be removed from the partially submerged position below the work deck 706, as shown in FIG. 4. The container shell 911 comprises an engagement feature (not shown) registered with a corresponding engagement feature (not shown) on the container 100, such that the container handling machine 910 can pick up and lift the container 100 into the container shell 911.

In some examples, the container shell 911 may comprise a rack and pinion arrangement, for example, to engage and lift the container 100 up into the container shell 911. It will be appreciated that the container handling machine 910 may be provided with myriad mechanical, electromechanical and/or hydraulic arrangements to lift the containers 100 into the container shell 911.

It will be apparent to a person skilled in the art that the specific engagement features of the container handling machine 910 and the containers 100 is not important, and may be provided in a plurality of different ways.

Figure 5:
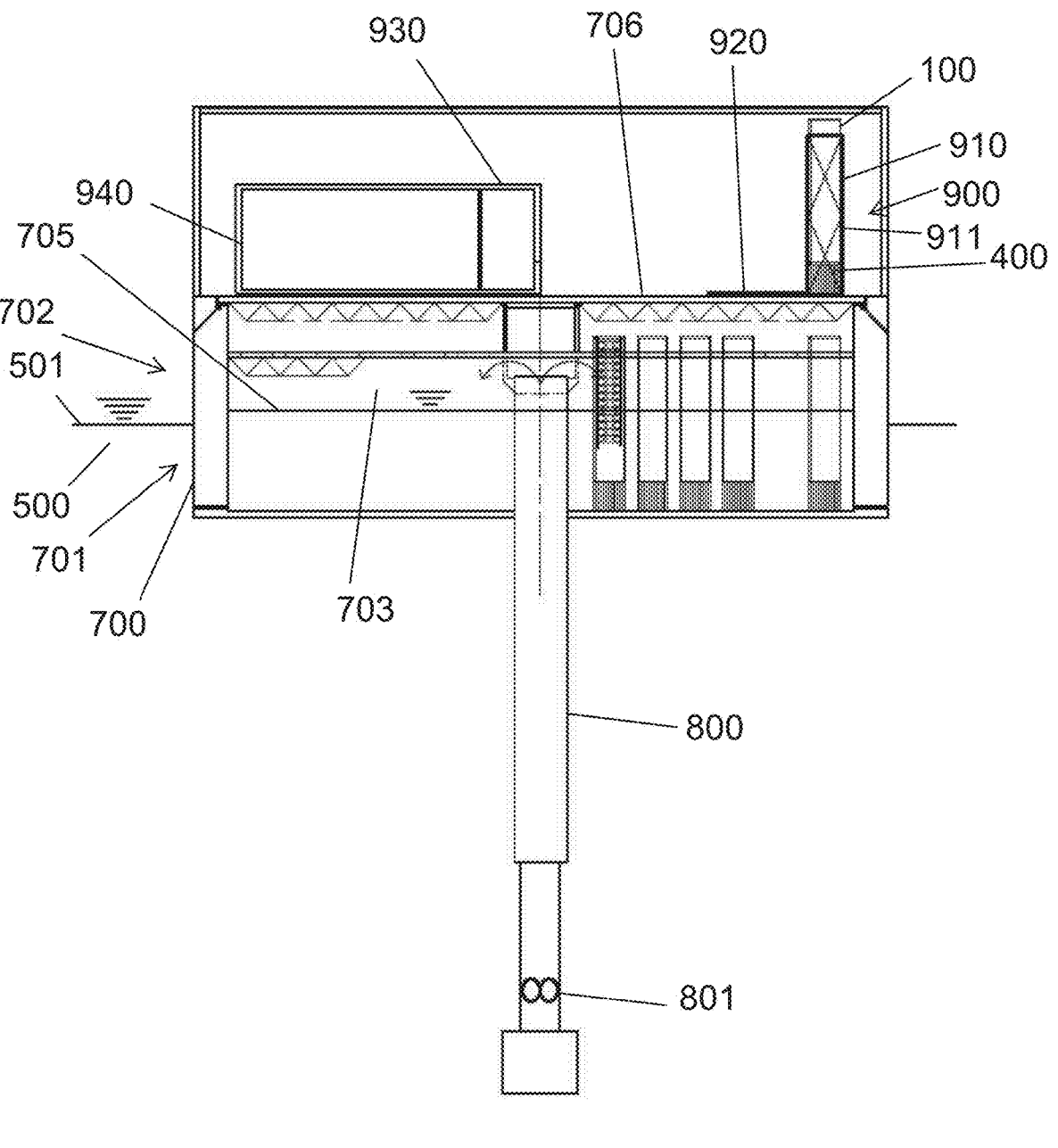
Figure 6:
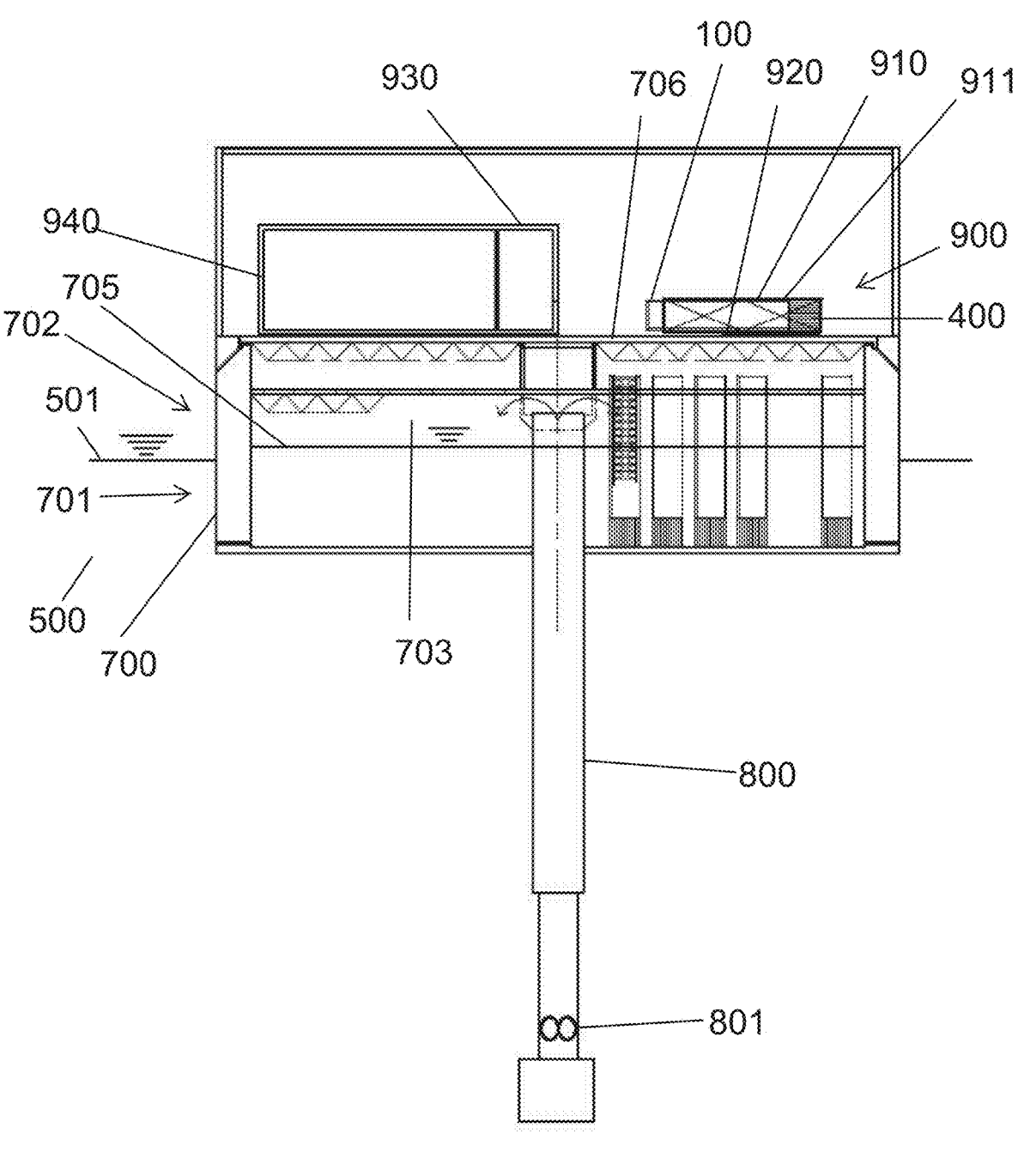

As shown in FIG. 5, when the container 100 has been removed from the submerged position, the container 100 is temporarily held within the container shell 911 which is moved across the skid 920 such that the container shell 911 and container 100 held therewithin can be laid down from a vertical position shown in FIG. 5 to a horizontal position shown in FIG. 6.

Figure 7:
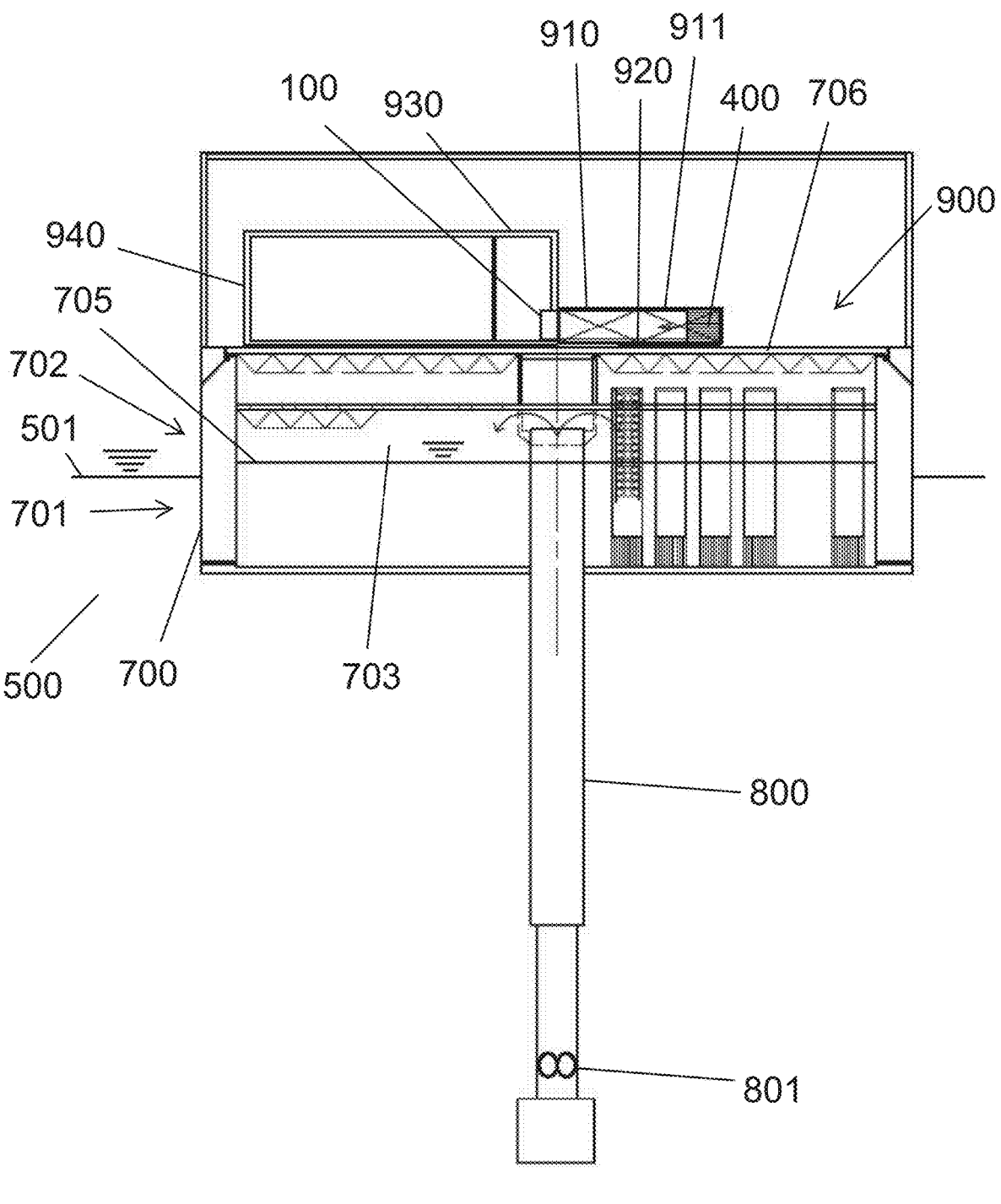

The container shell 911 can then be moved on the skid 920 to the transfer room 930 as shown in FIG. 7. To move the container shell 911 on the skid 920, the container handling system 900 may be provided with any suitable means to convey the container shell 911, such as a belt or drive train, for example.

Figure 8:
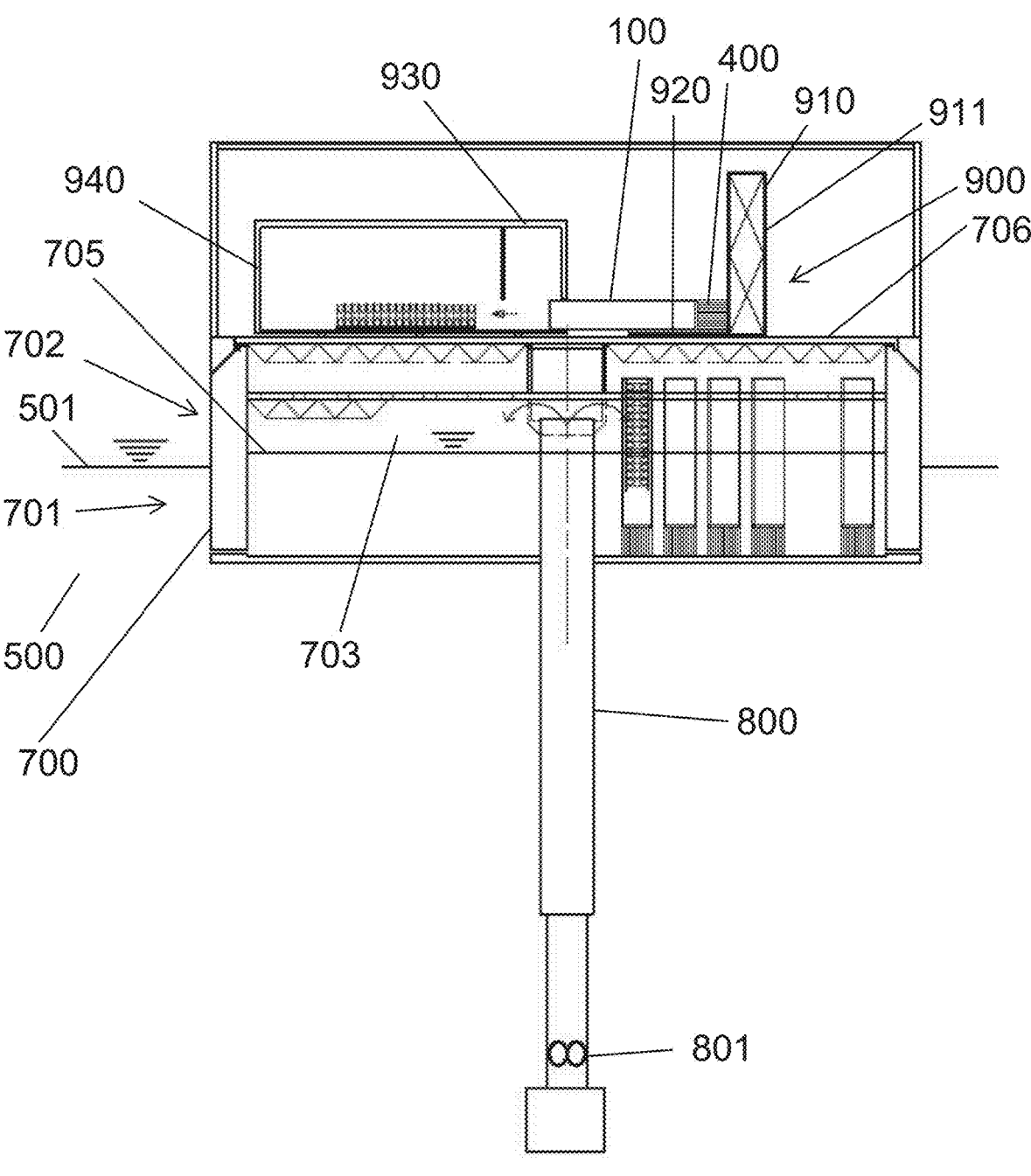
Figure 9:
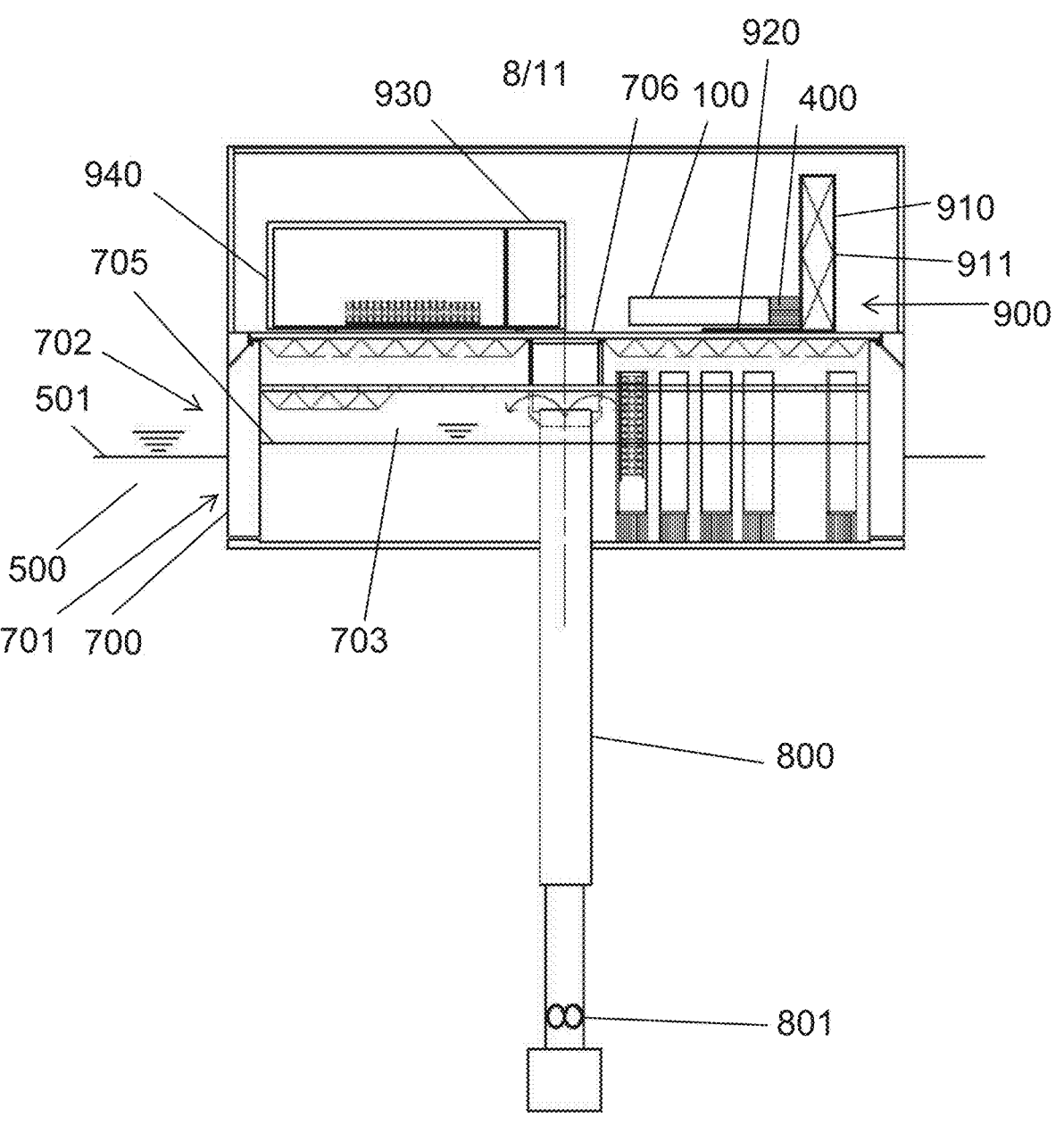

As shown in FIG. 8, the container shell 911 can then leave the container 100 located at least partially in the transfer room 930. In this connection, the container shell 911 can be detached from the container 100, and can then continue to manoeuvre other containers 100 if required. The transfer room 930 is configured to maintain a safe environment for the opening of the container 100. In this connection, the transfer room 930 may be configured to be watertight against the internal volume 703 of the structure 700, such that when a container 100 is opened within the transfer room 930, no water or contaminants from the internal volume 703 may reach the sensitive components held within the container 100. In this connection, in some examples (not shown), the transfer room 930 may be provided with cleaning facilities to clean the container 100 before the container 100 is opened and the sensitive data centre 200 is removed from the container 100. Additionally, or alternatively, the transfer room 930 may be provided with sensors to monitor the environment in the transfer room 930 before the container 100 is opened. Furthermore, the transfer room 930 may be provided with means for adjusting the environmental conditions within the transfer room 930.

Once the container 100 is opened in the transfer room 930, the data centre 200, or components thereof, can be removed and transferred to the clean room 940 as shown in FIG. 8. Between the transfer room 930 and the clean room 940, there is a hatch which can be opened to provide transfer of the data centre 200 from the transfer room 930 to the clean room 940. Once the data centre 200 is within the clean room 940, the hatch can be closed again to maintain a clean and controlled environment within the clean room 940 for the sensitive electronics to be serviced and maintained within. In this connection, the clean room 940 may be provided with sensors and equipment to monitor and adjust the environment within the clean room 940. For example, it may be desirable to maintain the clean room 940 at a specific humidity such that the data centre 200 is not damaged or degraded. The clean room 940 may therefore be provided with one or more humidity sensors and a means for adjusting the humidity within the clean room 940 if the humidity is too high or too low, for example.

Figure 10:
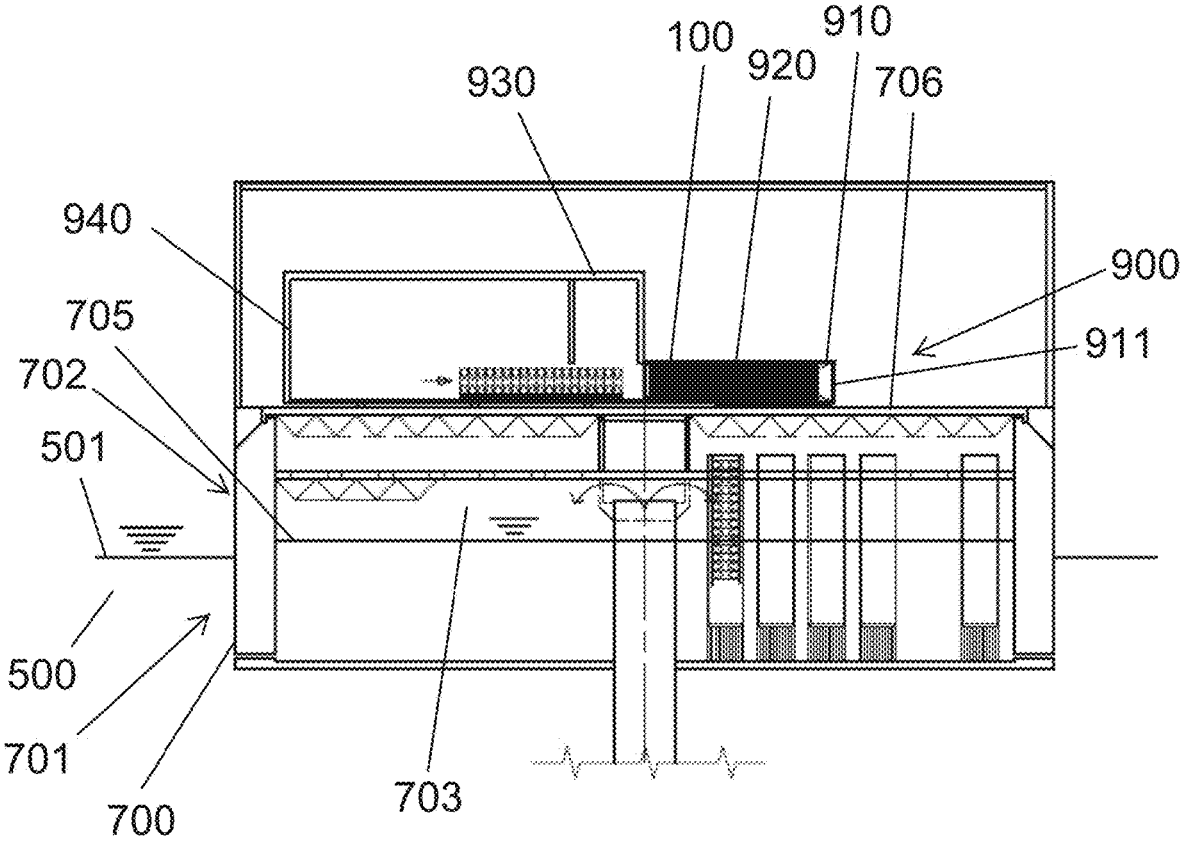

Within the clean room 940, the data centre 200 may be serviced and maintained. Maintenance may be performed by remotely controlled machines, by robots or automated in another way. Alternatively, the clean room 940 may be accessible such that technicians may access the data centre 200 to maintain it manually. Once servicing and maintenance has been performed, the hatch can be opened again and the data centre 200 can be transferred back into the container 100 within the container shell 911, as shown in FIG. 10. The container shell 911 can then be used to deliver the container 100 back into the submerged position below the work deck 706.

In the example method of servicing and maintaining a data centre 200 shown in FIGS. 4 to 10, the heat exchanger 400 is brought up to the work deck 706 with the container 100. The heat exchanger 400 may need to be serviced and maintained, and so it may be advantageous to be able to lift the heat exchanger 400 out of the water whilst lifting the container 100. The heat exchanger 400 may need to be cleaned of marine life, for example, which can be performed on the work deck 706.

In other examples, the heat exchanger 400 may be detached from the container 100 when the container 100 is lifted from below the deck 706. The previously discussed connections between the heat exchanger 400 and the container 100 may be self-sealing connections such that when the container 100 is disconnected from the heat exchanger 400, the flow channels 110, 120, 121 in the container 100 are automatically sealed and the flow channels 410, 420, 421 in the heat exchanger 400 are automatically sealed, thus maintaining the flowable heat transfer medium 600 within the container 100 and heat exchanger 400 and avoiding leakage of the heat transfer medium 600. In some examples, the connections between the heat exchangers 400 and the containers 100 may be stab connections such that the container 100 can be lowered down onto the heat exchanger 400 and stabbed into the heat exchanger 400 to reconnect the flow channels 110, 120, 121 in the container 100 with the flow channels 410, 420, 421 in the heat exchanger 400.

It may be advantageous in some examples to provide for disconnection of the container 100 from the heat exchanger 400 when the container 100 is lifted out of partial submersion. For example, if the container 100 is to be shipped to another location for servicing or maintenance of the data centre 200 or for servicing or maintenance of the container 100, it may be advantageous to leave the heat exchanger 400 submerged and in situ within the structure 700, ready for connection with a new container 100.

By providing the heat exchangers 400 and the containers 100 in a modular fashion, shipping and transportation costs can be reduced when only the container 100 is required to be shipped.

Figure 11:
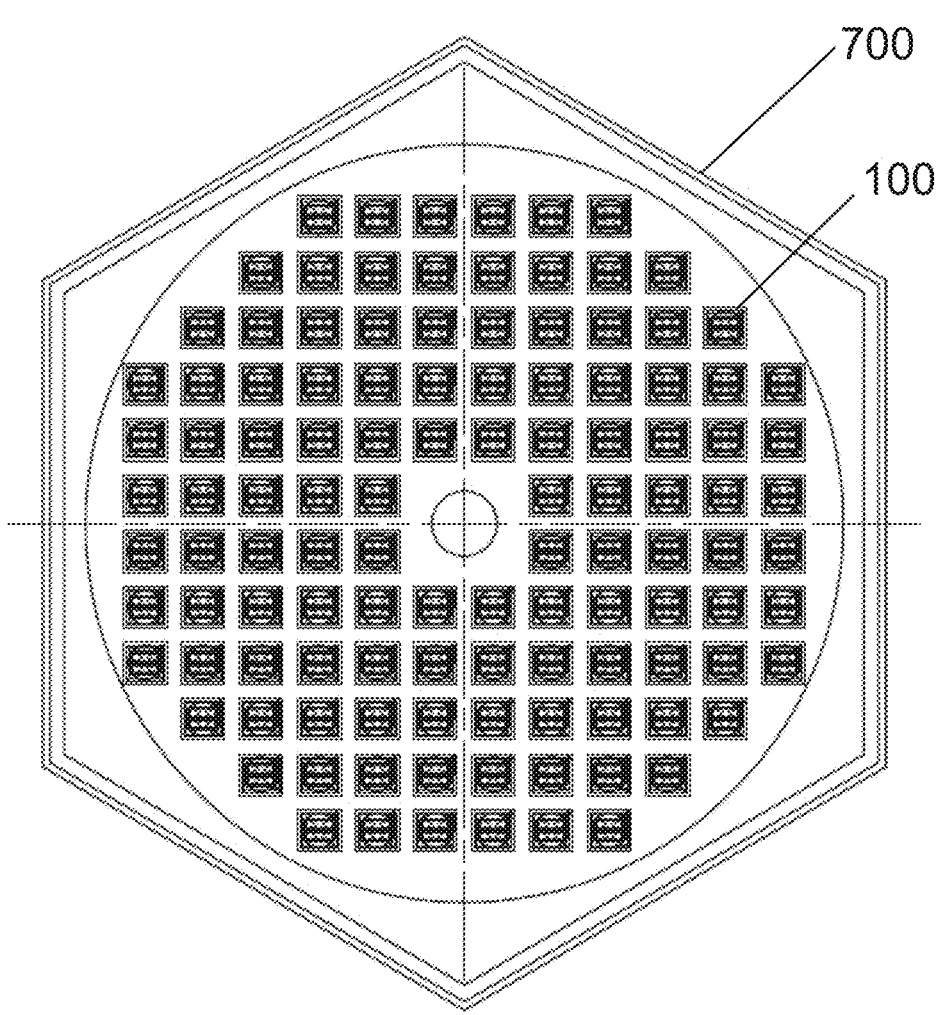
FIGS. 11 and 12 show an example configuration of containers within a structure.
Figure 12:
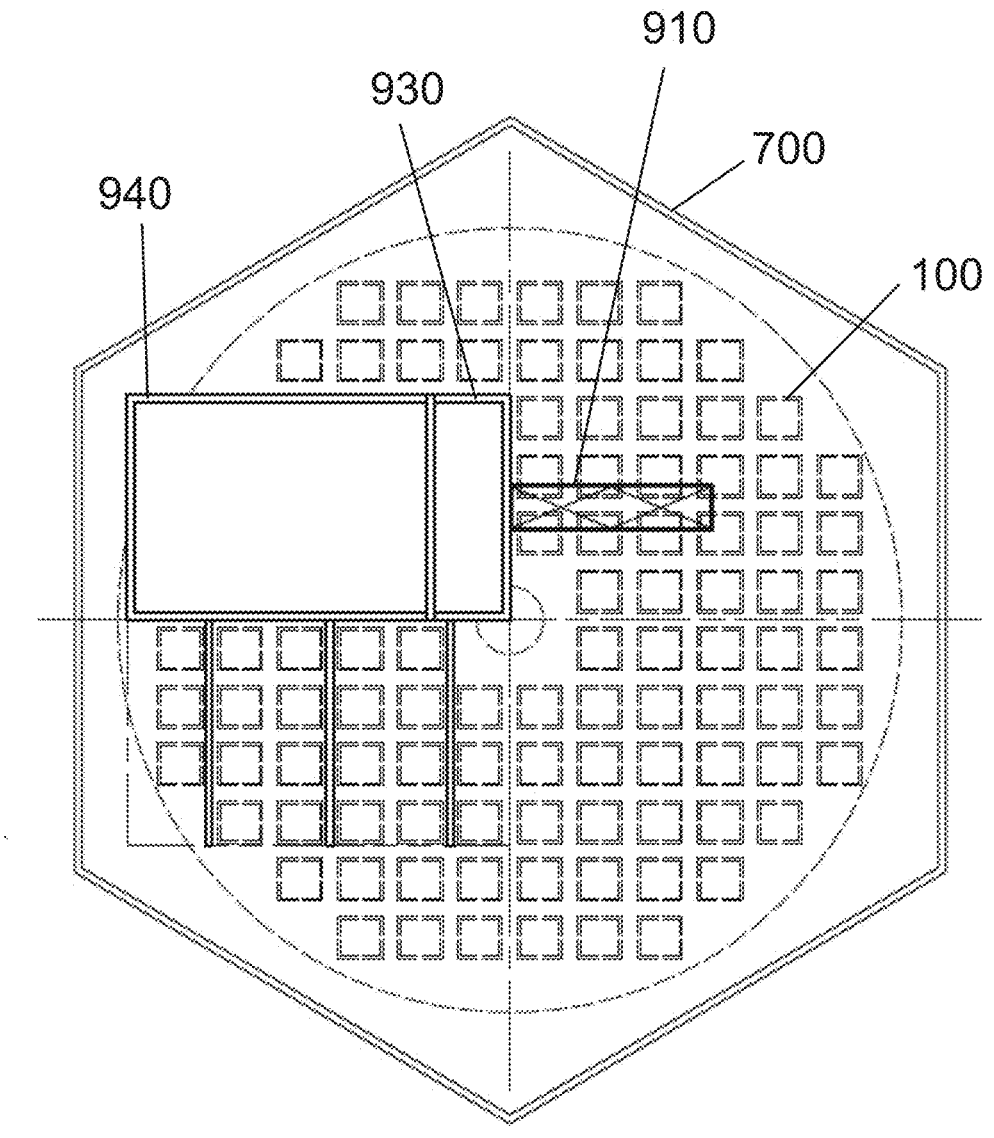

The structure 700, although only shown in two dimensions in FIGS. 4 to 10, may be provided in a plurality of different shapes. For example, the structure 700 may in some examples be a hexagonal prism, as shown in the cross-sectional view through the structure 700 shown in FIG. 11 and the top view shown in FIG. 12.

In some examples (not shown), a plurality of structures 700 may be provided with mechanical connections between the structures 700. In this connection, the plurality of structures 700 may be configured to be connected together in a modular fashion.

The structure 700 may in some examples comprise opaque surfaces such that no light can be transmitted through parts of the structure 700. In this connection, light can be stopped from reaching the containers 100 and/or heat exchangers 400, for example, to further inhibit marine growth thereon. In some examples the structure 700 may be entirely opaque.

The structure 700 may be connected to or be part of a larger vessel such as a boat, ship, offshore platform or floating structure. In some examples the structure 700 may itself be a ship or boat, wherein the containers 100 are arranged in the hull of the ship or boat.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements.

The mere fact that certain measures are recited in mutually different dependent claims does not indicate that a combination of these measures cannot be used to advantage.

The invention claimed is:

1. A container for housing first and second data centers and connecting to a heat exchanger in use, the container comprising:
   an outer shell defining an inside of the container and an outside of the container, the outer shell comprising:
      a container inlet port for receiving a flowable heat transfer fluid from the heat exchanger in use;
      a first container outlet port for delivering the flowable heat transfer fluid to the heat exchanger in use;
      a second container outlet port for delivering the flowable heat transfer fluid to the heat exchanger in use,
      wherein the container is disconnectable from the heat exchanger;
   a means for holding the first data center at a first location inside the container;
   a means for holding the second data center at a second location inside the container; and
   a container fluid flow network fluidly connecting the container inlet port with the first container outlet port and fluidly connecting the container inlet port with the second container outlet port;
   wherein the container fluid flow network comprises:
      a central fluid flow channel directly connected to the container inlet port;
      a first outer fluid flow channel directly connected to the first container outlet port; and
      a second outer fluid flow channel directly connected to the second container outlet port;
      wherein the central fluid flow channel and the first outer fluid flow channel form a first fluid flow path that loops around the first data center such that in use the flowable heat transfer fluid can enter the container at the container inlet port and extract first heat from the first data center before exiting the container at the first container outlet port;
      wherein the central fluid flow channel and the second outer fluid flow channel form a second fluid flow path that loops around the second data center such that in use the flowable heat transfer fluid can enter the container at the container inlet port and extract second heat from the second data center before exiting the container at the second container outlet port;
      wherein the container fluid flow network and a heat exchanger fluid flow network of the heat exchanger form a closed fluid flow network that is sealed within the container and the heat exchanger when the container is attached to the heat exchanger, and
   wherein the container is configured to be at least partially submerged in water and the outer shell is configured to stop the water from entering the container when the container is attached to the heat exchanger.

2. The container according to claim 1, wherein the outer shell is in the form of a rectangular prism.

3. The container according to claim 1, wherein the container inlet port comprises a non-return valve and/or the first container outlet port comprises a non-return valve.

4. The container according to claim 1, wherein the container inlet port is configured to connect to a heat exchanger outlet port of the heat exchanger and the first container outlet port is configured to connect to a first heat exchanger inlet port of the heat exchanger.

5. The container according to claim 1, wherein the container is configured to be stab connected to the heat exchanger in use.

6. The container according to claim 1, wherein the means for holding the first data center is one or more of: a rack, a plurality of racks, a slot or a plurality of slots.

7. The container according to claim 1, wherein the first location is offset from the outer shell and the first fluid flow path is at least partially located between the outer shell and the first location.

8. The container according to claim 1, wherein the means for holding the second data center is one or more of: a rack, a plurality of racks, a slot or a plurality of slots.

9. The container according to claim 1, wherein the second location is offset from the outer shell and the second fluid flow path is at least partially located between the outer shell and the second location.

10. A system for cooling first and second data centers, the system comprising:

a container according to claim 1;

a positive displacement device;

the heat exchanger comprising a first heat exchanger inlet port and a heat exchanger outlet port;

wherein the heat exchanger is operatively connected to the container such that the heat exchanger outlet port is fluidly connected to the container inlet port and the first heat exchanger inlet port is fluidly connected to the first container outlet port;

the flowable heat transfer fluid flows through the container fluid flow network and the heat exchanger fluid flow network of the closed fluid flow network; and the positive displacement device is configured to circulate the flowable heat transfer fluid between the container fluid flow network and the heat exchanger fluid flow network, such that the flowable heat transfer fluid can remove the first heat from the first data center and transfer the first heat to the heat exchanger in use.

11. The system according to claim 10, wherein the heat exchanger further comprises a heat exchange medium configured to remove the first heat from the flowable heat transfer fluid and to dump the first heat to an external fluid surrounding the heat exchanger.

12. A method of cooling a data center, comprising steps of:

providing a system according to claim 10;

powering the first data center to generate the first heat; and circulating the flowable heat transfer fluid through the container fluid flow network and a heat exchanger fluid flow network of the closed fluid flow network, such that the first heat is removed from the first data center and transferred to the heat exchanger.

13. A method of cooling a data center, comprising steps of:

providing a system according to claim 11;

submerging the heat exchanger in an external fluid;

powering the first data center to generate the first heat;

circulating the flowable heat transfer fluid through the container fluid flow network and a heat exchanger fluid flow network of the closed fluid flow network, such that the first heat is removed from the first data center and transferred to the heat exchanger; and dumping the first heat from the heat exchanger to the external fluid surrounding the heat exchanger.

14. The method of claim 13, wherein the external fluid the heat exchanger is submerged in is the water.

15. A system for cooling a first data center and a second data center, the system comprising:

a container according to claim 1;

a positive displacement device;

the heat exchanger comprising a first heat exchanger inlet port, a second heat exchanger inlet port and a first heat exchanger outlet port;

wherein the heat exchanger is operatively connected to the container such that the heat exchanger outlet port is fluidly connected to the container inlet port, the first heat exchanger inlet port is fluidly connected to the first container outlet port and the second heat exchanger inlet port is fluidly connected to the second container outlet port;

wherein the flowable heat transfer fluid flows through the container fluid flow network and the heat exchanger fluid flow network of the closed fluid flow network; and the positive displacement device is configured to circulate the flowable heat transfer fluid between the container fluid flow network and the heat exchanger fluid flow network, such that the flowable heat transfer fluid can remove the first and second heats from the first and second data centers, respectively, and transfer the first and second heats to the heat exchanger in use.

16. The system according to claim 15, wherein the heat exchanger further comprises a heat exchange medium configured to remove the first and second heats from the flowable heat transfer fluid and to dump the first and second heats to the external fluid surrounding the heat exchanger.

* * * * *